United States Patent [19]

Mukai

[11] Patent Number: 4,920,070

[45] Date of Patent: Apr. 24, 1990

[54] METHOD FOR FORMING WIRINGS FOR A SEMICONDUCTOR DEVICE BY FILLING VERY NARROW VIA HOLES

[75] Inventor: Ryoichi Mukai, Kawasaki, Japan

[73] Assignee: Fujitsu Limited, Kawasaki, Japan

[21] Appl. No.: 127,042

[22] Filed: Nov. 27, 1987

[30] Foreign Application Priority Data

Feb. 19, 1987 [JP] Japan .................. 62-036303
Feb. 27, 1987 [JP] Japan .................. 62-046031

[51] Int. Cl.$^5$ .................. H01L 21/268; H01L 21/283
[52] U.S. Cl. .................. 437/173; 437/194; 437/203
[58] Field of Search .................. 437/173, 194, 203, 187; 148/DIG. 90, DIG. 93, DIG. 134

[56] References Cited

U.S. PATENT DOCUMENTS

| | | | |
|---|---|---|---|
| 4,261,764 | 4/1981 | Narayan | 437/19 |
| 4,327,476 | 5/1982 | Iwai et al. | 437/203 |
| 4,562,640 | 1/1986 | Widmann et al. | 437/194 |
| 4,592,802 | 6/1986 | Deleonibus | 437/194 |
| 4,758,533 | 7/1988 | Magee et al. | 437/173 |
| 4,800,179 | 1/1989 | Mukai | 437/203 |

FOREIGN PATENT DOCUMENTS

| | | | |
|---|---|---|---|
| 0162244 | 12/1980 | Japan | 437/203 |
| 0088543 | 5/1986 | Japan | 437/194 |
| 61-93650 | 5/1986 | Japan | 437/203 |
| 61-152040 | 7/1986 | Japan | 437/203 |

OTHER PUBLICATIONS

Tuckerman et al., Solid State Technology, (Apr. 1986), pp. 129–134.

Primary Examiner—Olik Chaudhuri
Attorney, Agent, or Firm—Staas & Halsey

[57] ABSTRACT

A method for fabricating a semiconductor device with via holes, each having a width less than one micrometer and an aspect ratio more than one, assures proper filling of the via rolls with metal from a sputtered metal layer on an insulating layer having the via holes and formed on a semiconductor substrate by using a pulsed laser beam for planarization. The sputtered metal layer must be thick enough to provide the planarized metal layer with 0.5 micrometer thickness in the vicinity of the via holes for avoiding the planarized metal layer being torn around the via holes and thin enough not so as to produce caves when the sputtered metal layer is planarized by the pulsed laser beam.

26 Claims, 12 Drawing Sheets

METHOD FOR FORMING WIRINGS FOR A SEMICONDUCTOR DEVICE BY FILLING VERY NARROW VIA HOLES

BACKGROUND OF THE INVENTION

1. Field of the Invention

The present invention relates to a method for forming wirings and associated via holes of a semiconductor device, and more particularly to a method for forming wirings by irradiating a laser beam on a metal layer sputtered on an insulating layer formed on a semiconductor substrate, with filling via holes previously provided in the insulating layer with melted material of the metal layer, so that the wirings are electrically well connected with the semiconductor substrate through the via holes.

Recently, since the packing density of semiconductor devices has increased, wirings and associated via holes in the semiconductor device have become microscopic in their dimensions. For example, in the case of very large scale integration (VLSI) semiconductor devices, the smallest portions of the wirings and via holes are smaller than one micrometer ($\mu$m).

Usually, wirings of a semiconductor device are formed by patterning a metal layer formed by sputtering electrically conductive material, such as aluminum (Al), onto an insulating layer having a plurality of via holes. In the process of such sputtering, the via holes are filled with the electrically conductive material while the metal layer is being formed on a surface of the insulating layer. However, in such a sputtering process, it has become hard to fill the via holes perfectly since each of the via holes can be so narrow that its diameter becomes smaller than 1 $\mu$m and an aspect ratio, which is a ratio of depth to diameter of a hole, is more than one. This results in limiting the fabrication of minute metal layers and via holes. Accordingly, a new method for overcoming the above problem is required.

As one of the new methods, a laser melting method has appeared because the laser melting method is simple in the fabricating process of the semiconductor device, compared with other methods, such as a selective chemical vapor deposition (CVD) method or a bias sputtering method, for planarizing the metal layer. The laser melting method is a method for melting the metal layer by irradiating the layer with a laser beam. And it is expected that when the metal layer is melted by the laser beam, the via holes are sufficiently filled with melted metal while the surface of the metal layer is being planarized. Therefore, the laser melting method will be called the "laser filling method" hereinafter.

2. Description of the Related Art

As mentioned above, in the fabricating process of the semiconductor devices, the laser filling method is new and under development, and there are some reports as to trials of the laser filling method. For example, a report as to the laser filling method was presented by D. B. Tuckerman and A. H. Weisberg in a paper entitled "Planarization of Gold and Aluminum Thin Films Using a Pulsed Laser", in *IEEE Electron Device Lett.*, vol. EDL-7, pp. 1-4, in 1986.

The prior art for planarizing the surface of the metal layer using the laser filling method will be described below, and the problems occurred in the prior art will be discussed referring to FIGS. 1-4.

FIGS. 1(a)-(b) show the general construction of an insulating layer having a via hole, formed on a semiconductor substrate of a semiconductor device such as the VLSI semiconductor device. FIG. 1(a) shows a partial plane view of an insulating layer 2 formed on a semiconductor (silicon (Si)) substrate 1 so as to indicate a via hole 3 which is one of a plurality of via holes provided in the insulating layer 2. FIG. 1(b) shows a cross sectional view along the line A-A' in FIG. 1(a).

In FIG. 1(b), the insulating layer 2 made of silicon dioxide ($SiO_2$) of 1 $\mu$m thickness is deposited on a surface, having a (100) surface orientation, of the semiconductor substrate 1. Then, the via hole 3 is formed in the insulating layer 2 by applying a method combining a photolithography method and an etching method.

The insulating layer 2 can also be made of phosphosilicate glass (PSG) or silicon nitride ($Si_3N_4$). A layer combining two layers, such as $SiO_2$ and PSG or $Si_3N_4$ and PSG, also can be used as the insulating layer 2.

After forming the via hole 3 in the insulating layer 2, a sputtered metal layer 4, made of Al for example, is formed on a surface of the insulating layer 2 by applying a sputtering method such as a magnetron sputtering method.

FIGS. 2(a)-(c) show construction of a sputtered metal layer 4 formed on an insulating layer, as an example of the prior art, particularly around a via hole 3. In FIGS. 2(a)-(c), the same reference numerals as in FIGS. 1(a)-(b) designate the same elements as in FIGS. 1(a)-(b). FIG. 2(a) shows a partial plan view of the sputtered metal layer 4 around the via hole 3, and FIG. 2(b) shows a cross sectional view along the line B-B' in FIG. 2(a). As shown in FIGS. 2(a) and 2(b), usually, a size of an aperture of the via hole 3 is relatively large, such as 3 $\mu$m. Therefore, the sputtered metal layer 4 can be formed even on a bottom surface 101, which is a partial surface of the semiconductive substrate 1, of the via hole 3, even though a hollow part 41 is produced on a surface of the metal layer 4 at the via hole 3. Accordingly, when the laser filling method is applied to the surface of the sputtered metal layer 4, the hollow part 41 is planarized and so a planarized metal layer 4' can be formed together with perfectly filling the via hole 3 with a melted metal layer, as shown in FIG. 2(c). These details are described in the paper by D. B. Tuckerman and A. H. Weisberg, mentioned above.

However, in the case of very narrow via holes, such that each via hole has a small aperture size such as 1 $\mu$m or less, and a high aspect ratio, such as one or more, the thickness of the sputtered metal layer 4 becomes very significant for filling the via holes with the material of the metal layer. FIGS. 3(a)-(c) show a case wherein the sputtered metal layer 4 is too thick, and FIGS. 4(a)-(c) show a case of being too thin. In FIGS. 3 and 4, the same reference numerals as in FIG. 2 designate the same elements as in FIG. 2. Similarly to FIGS. 2(a) and 2(b), FIGS. 3(a) and 4(a) show respectively a partial plan view of the metal layer 4 sputtered on the surface of the insulating layer 2, particularly around a via hole 3, and FIGS. 3(b) and 4(b) show cross sectional views along the line C-C' in FIG. 3(a) and along the line D-D' in FIG. 4(a) respectively.

When the sputtered metal layer 4 is too thick compared with a small aperture size of the narrow via hole 3, a part of the sputtered metal layer 4 formed around the aperture of the via hole 3 becomes thick so that the aperture is almost closed, as shown by a portion 42 in FIGS. 3(a) and 3(b). Therefore, when the laser filling method is applied to the surface of the sputtered metal layer 4 for the planarization, the melted metal layer happens to close the portion 42 completely, which produces a cave 43 in the via hole 3 as shown in FIG. 3(c). This results in increasing resistance at the via hole 3. This cave formation is characteristic to the laser filling of submicron via holes. About this cave 43, Tuckerman says nothing. The reasons why the case 43 is produced are that: (1) the sputtered metal layer is too thick; (2) each via hole has an aperture size which is too small and an aspect ratio which is too high; and (3) the viscosity of the melted metal is too large when the sputtered metal layer is melted by the laser beam irradiation.

When sputtered metal layer 4 is too thin, only poor metal material is formed on inside and bottom walls of the via hole 3, as shown in FIG. 4(b). Therefore, when the laser filling method is applied to the sputtered metal layer 4, a part of the melted metal layer happens to be torn off the insulating layer 2, as shown by a portion 44 in FIG. 4(c). This tearing phenomenon occurs because the thin sputtered metal layer 4 is melted by the laser beam. Since the thickness of the layer 4 is too thin, the quantity of the melted metal is insufficient for filling the via hole 3 and maintaining a flat surface of the melted metal against its surface tension. This results in completely cutting off the electrical contact between the planarized metal layer 4' and the semiconductor substrate 1 through the via hole 3. When this tearing phenomenon occurs, additional electrically conductive material must be deposited on the planarized metal layer 4' for repairing the torn portion 44 so as to reform the connection.

SUMMARY OF THE INVENTION

Therefore, an object of the present invention is to improve the planarizing process, performed by using the laser filling method, of the sputtered metal layer, in the fabricating process of the semiconductor device, so as to fill the very narrow via holes associated with the wirings and having an aperture size smaller than 1 $\mu$m and an aspect ratio more than one with the electrically conductive material.

Another object of the present invention is to increase the reliability of the semiconductor device having via holes associated with the wirings.

Still another object of the present invention is to decrease the fabrication cost of the semiconductor device having via holes associated with the wirings.

The above objects are achieved by controlling the quantity of the electrically conductive material for forming the metal layer by the sputtering method so that the calculated thickness of the ideally planarized metal layer is more than 0.5 $\mu$m but not so thick as to generate caves or voids in the via holes after planarizing the sputtered metal layer by applying the laser filling method.

BRIEF DESCRIPTION OF THE DRAWINGS

FIG. 8(a) is a partial plan view of a double layered insulator having a groove;

FIG. 8(b) is a cross-sectional view along the line F–F' in FIG. 8(a);

FIG. 8(c) is a plan view of the groove, being the same as the groove in FIG. 8(a), having two via holes in an insulating layer;

FIG. 8(d) is a cross-sectional view along the line G–G' in FIG. 8(c);

FIG. 8(e) is a cross-sectional view of a sputtered metal layer sputtered on the via holes and the groove of the insulating layer formed on a semiconductor substrate;

FIG. 8(f) is a cross-sectional view of a planarized metal layer planarized with filling the via holes with metal;

FIG. 8(g) is a cross-sectional view of a buried wiring formed by etching the planarized metal layer in FIG. 8(f);

FIG. 8(h) is a plan view of the buried wiring connected with the via holes;

DESCRIPTION OF THE PREFERRED EMBODIMENTS

When the metal layer sputtered on the insulating layer having via holes is melted by a pulsed energy beam such as a pulsed laser beam for planarizing the sputtered metal layer, a part of the instantaneously melted metal layer around the aperture of each via hole flows into the via hole.

When the metal layer is melted by the irradiation of the pulsed laser beam, whether the melted layer is torn from the insulating layer nearby the aperture of the via hole mainly depends on: (1) the energy of the pulsed laser beam; (2) the quantity of the instantaneously melted metal layer; (3) the total volume of the via holes provided in the insulating layer in a laser irradiated region; and (4) the viscosity and the surface tension of the melted metal layer.

According to the experimentation concerning the above, performed by inventor, using Al or aluminum alloy as the electrically conductive material, it has been found that the calculated thickness of the metal planarized layer ideally must be more than 0.5 $\mu$m for realizing the perfect filling of the via holes in the step for planarizing the sputtered metal layer by irradiation with the pulsed laser beam, and it has been found that when the thickness of the sputtered metal layer is controlled to be properly thin, the problem of the cave occurring in the via hole can be avoided.

Figure 1A:
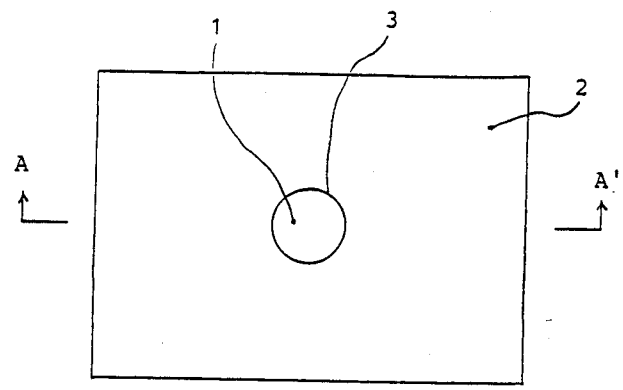
FIG. 1(a) is a partial plan view of an insulating layer, having a via hole, formed on a semiconductor substrate.
Figure 1B:
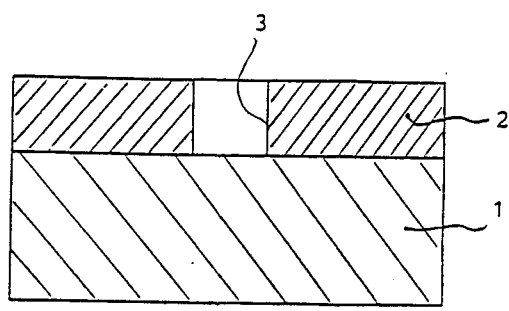
FIG. 1(b) is a cross-sectional view along the line A–A' in FIG. 1(a)
Figure 2A:
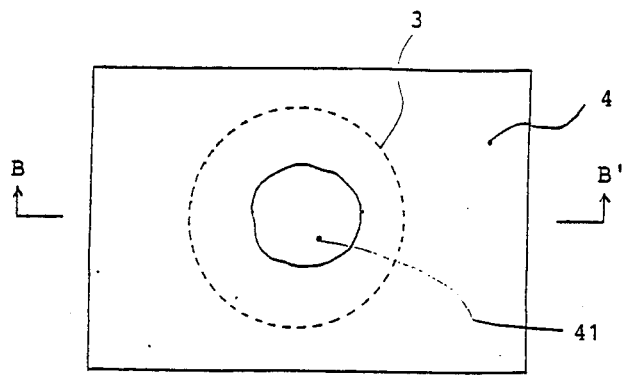
FIG. 2(a) is a partial plan view of a sputtered metal layer sputtered on an insulating layer having a large sized via hole and formed on a semiconductor substrate.
Figure 2B:
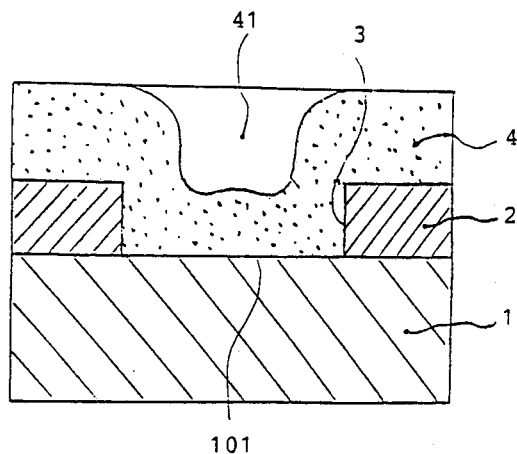
FIG. 2(b) is a cross-sectional view along the line B–B' in FIG. 2(a)
Figure 2C:
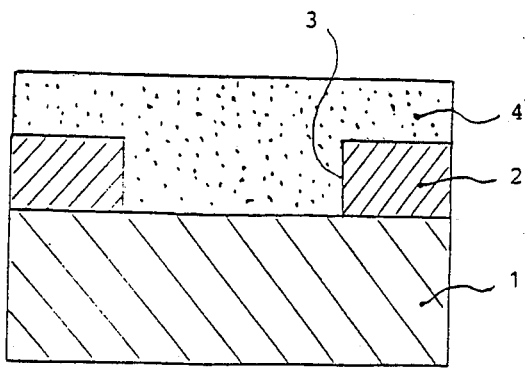
FIG. 2(c) is a cross-sectional view of a planarized metal layer on the insulating layer formed on the semiconductor substrate in FIG. 2(b), along the line B–B'.
Figure 3A:
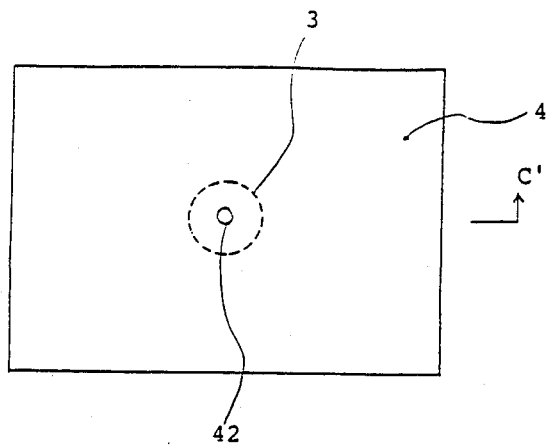
FIG. 3(a) is a partial plan view of a thick sputtered metal layer sputtered by the prior art method on an insulating layer having the small sized via hole and formed on a semiconductor substrate.
Figure 3B:
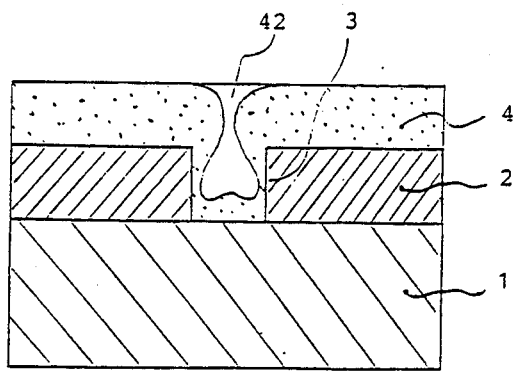
FIG. 3(b) is a cross-sectional view along the line C–C' in FIG. 3(a)
Figure 3C:
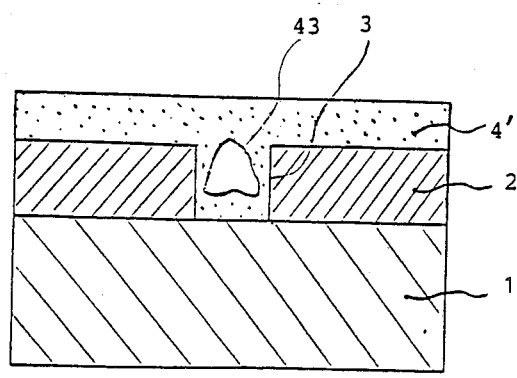
FIG. 3(c) is a cross-sectional view of a planarized metal layer having a cave in the small sized via hole formed on the insulating layer formed on the semiconductor substrate in FIG. 3(b), along the line C–C'.
Figure 4A:
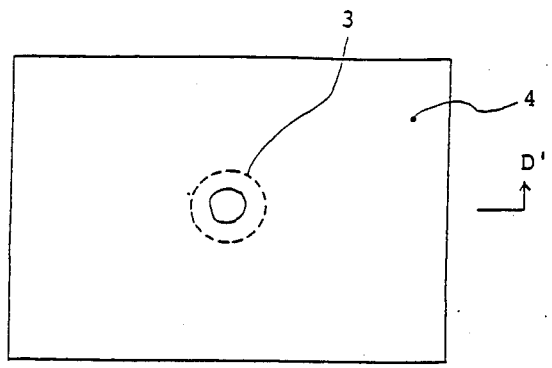
FIG. 4(a) is a partial plan view of a thin sputtered metal layer sputtered by the prior art method on an insulating layer, having a small sized via hole, formed on a semiconductor substrate.
Figure 4B:
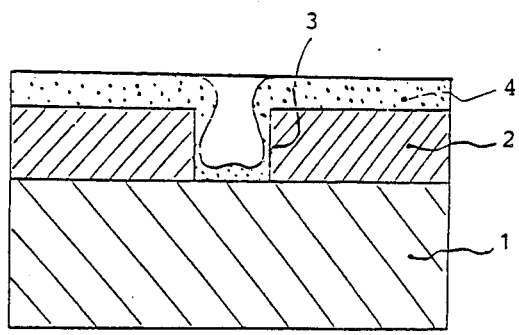
FIG. 4(b) is a cross-sectional view along the line D–D' in FIG. 4(a)
Figure 4C:
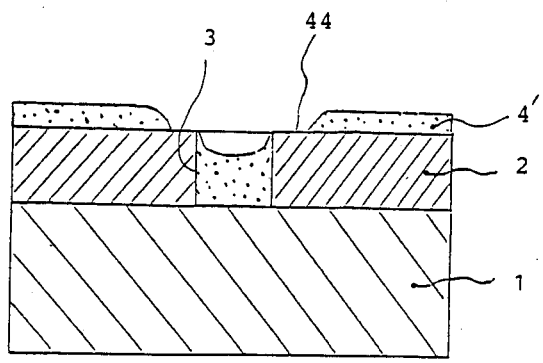
FIG. 4(c) is a cross-sectional view of a planarized metal layer, having a torn portion of the planarized metal layer around the small sized via hole, formed on the insulating layer on the semiconductor substrate in FIG. 4(b), along the line D–D'.
Figure 5A:
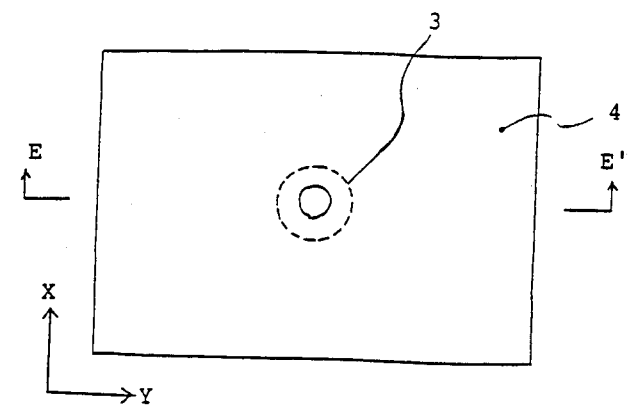
FIG. 5(a) is a partial plan view of a metal layer sputtered by the method embodying the present invention on an insulating layer having the small sized via hole and formed on a semiconductor substrate.
Figure 5B:
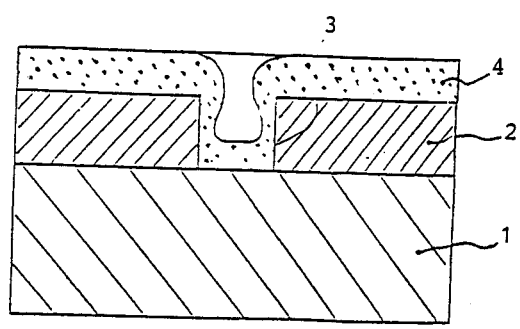
FIG. 5(b) is a cross-sectional view along the line E–E' in FIG. 5(a)
Figure 5C:
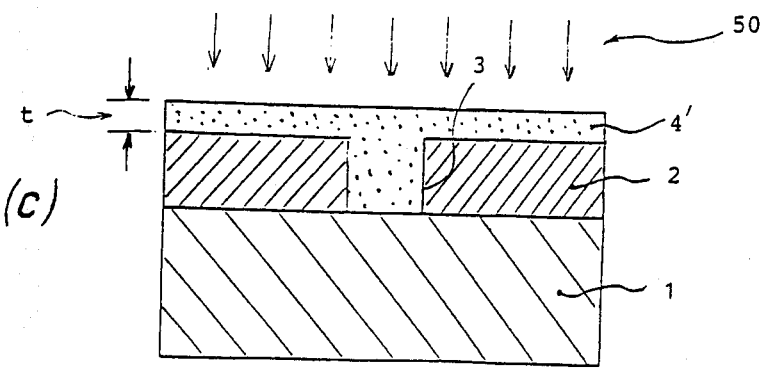
FIG. 5(c) is a cross-sectional view of a planarized metal layer formed on the insulating layer on the semiconductor substrate in FIG. 5(b), along the line E–E'.
Figure 5D:
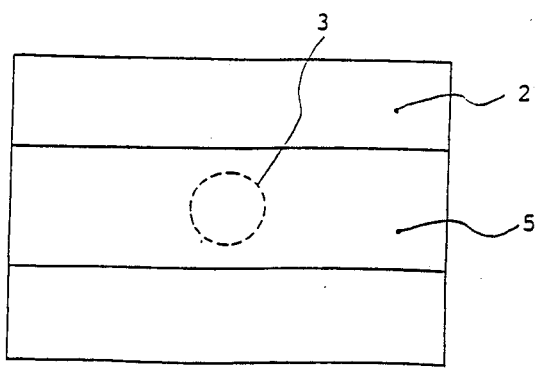
FIG. 5(d) is a plan view of the planarized and patterned metal layer in FIG. 5(c)

A first method embodying the present invention will be disclosed referring to FIGS. 5(a)-5(d), which show the fabrication steps of forming the metal layer by the sputtering method (FIGS. 5(a) and 5(b)), planarizing the metal layer together with filling the via holes perfectly by the laser filling method (FIG. 5(c)), and forming wirings (FIG. 5(d)). Similarly to FIGS. 4(a)-4(c), FIG. 5(a) shows a partial plan view of a sputtered metal layer 4 onto an insulating layer around a via hole 3, FIG. 5(b) is a cross-sectional view along the line E-E' in FIG. 5(a), and FIG. 5(c) is a cross-sectional view for explaining the planarization step along the line E-E'. FIG. 5(d) shows the same partial plan view as in FIG. 5(a), but shows a wiring 5 patterned on the insulating layer 2 by pattern etching the planarized metal layer 4' in FIG. 5(c). In FIGS. 5(a)-5(d), the same reference numerals as in FIGS. 4(a)-4(c) designate the same elements as in FIGS. 4(a)-4(c).

An insulating layer 2 made of $SiO_2$ is deposited on a surface, having (100) surface orientation, of an N-type Si substrate 1 so as to have 1 $\mu$m thickness, as shown in FIG. 5(b). After depositing the insulating layer 2 on the Si substrate 1, and applying methods of photolithography and anisotropic etching, thirty six cylindrical via holes 3, each having 1 $\mu$m aperture diameter and 1 $\mu$m depth, are provided in the insulating layer 2 so that the 36 via holes 3 are arranged having an equal interval between each other in X and Y directions in a square area of 10 $\mu$m $\times$ 10 $\mu$m. In FIGS. 5(a)-5(d), one of the 36 via holes is depicted. After providing the via holes 3 in the insulating layer 2, an electrically conductive material, such as Al, is sputtered on the surface of the insulating layer 2 having the via holes 3, so that a sputtered metal layer 4 is formed having 0.8 $\mu$m thickness, as shown in FIGS. 5(a) and 5(b). After forming the sputtered metal layer 4 on the insulating layer 2, an energy beam 50 is irradiated in one pulse on the surface of the sputtered metal layer 4. To produce the energy beam 50, an argon fluoride (ArF) excimer laser beam having characteristics of 193 nanometer (nm) wave length, 15 nanosecond (ns) pulse width and 200 milliwatt (mW) peak power is used. Because of designating the thickness of the sputtered metal layer to 0.8 $\mu$m, the sputtered metal layer 4 can be planarized so that the planarized metal layer 4' can be formed while perfectly filling the via holes 3 with the melted metal without the formation of caves or the problem of tearing the planarized metal layer 4' in the via hole region. After forming the planarized metal layer 4' by the laser filling method, a wiring 5 is formed on the insulating layer 2 by patterning the planarized metal layer 4' with a method of photolithography as shown in FIG. 5(d).

In addition to the above, the following conditions or alterations can be used:

(a) the area irradiated by the energy beam 50 is 2 mm $\times$ 0.8 mm at the surface of the sputtered metal layer 4, and the above planarizing process is performed under $1 \times 10^{-6}$ Torr vacuum condition for avoiding Al oxidation, or Al oxidation can also be avoided by using a non-oxidizing atmosphere, such as argon, hydrogen, or helium;

(b) as the energy beam, a krypton fluoride (KrF) excimer laser having 248 nm wave length or xenon chloride (XeCl) excimer laser having 308 nm wave length can be used instead of the ArF excimer laser, and when a CW laser, such as an Ar laser or a Kr laser, is to be used, an optical switch element which utilizes a non-linear optical element for obtaining an optical pulse having a pulse width less than 1 $\mu$s should be used; and (c) as the electrically conductive material, an Al-Si alloy or an Al-Cu alloy can be used instead of Al under the same condition.

Finally in this disclosure, the following fact has been found. In experiments, a thickness of from 0.51 to 0.52 $\mu$m of the planarized layer 4' was obtained above a flat part of the insulating layer 2 away from any via hole 3. These data almost coincide with a theoretical value of 0.517 $\mu$m, which is obtained in calculation if all the via holes were to be perfectly filled with the metal during the planarizing process.

Figure 6:
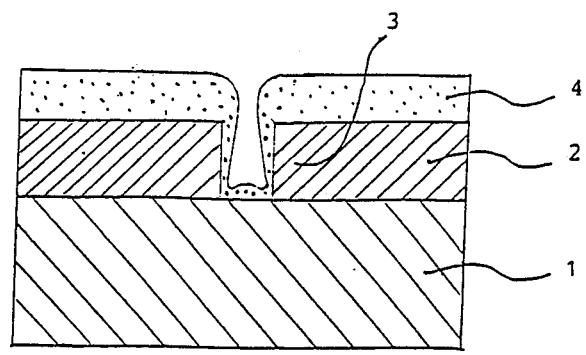
FIG. 6(a) is a cross-sectional view of a sputtered metal layer sputtered on an insulating layer having a very small sized via hole and a large aspect ratio.
FIG. 6(b) is a cross-sectional view of a planarized metal layer formed by planarizing the sputtered metal layer in FIG. 6(a) in circumstances of 200° C., in which a cave appears in the very small sized via hole.
FIG. 6(c) is a cross-sectional view of the planarized metal layer in circumstances of 300° C., in which no cave appears in the very small sized via hole.
Figure 6:
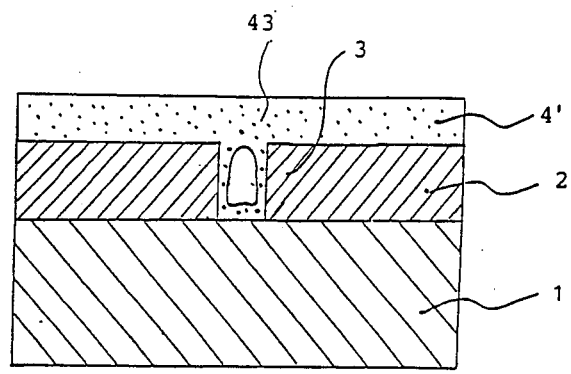
Figure 6:
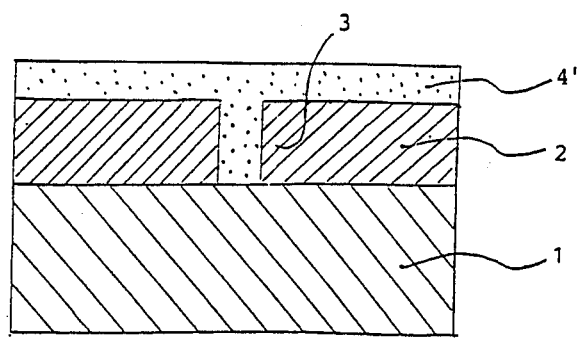

A second method embodying the present invention will be disclosed referring to FIGS. 6(a)-6(c).

Different points of the second method from the first method are as follows: the aperture diameter of each via hole 3 is changed to 0.8 $\mu$m from 1 $\mu$m; the thickness of the sputtered metal layer made of Al is changed to 0.7 $\mu$m from 0.8 $\mu$m; and particularly, the fabricating material having the sputtered metal layer 4 is heated up to 350° C.-400° C. in temperature, for example, by putting it on a heating block. Other conditions for the second method are the same as for the first method.

In this second method, similarly to the first method, the wirings can be fabricated without producing the problems of caves and torn metal layers. Since the sputtered metal layer is heated up, the melted metal is not cooled so quickly. Accordingly, a time duration during which the viscosity of the melted metal is low is lengthened, even though the sputtered metal layer 4 is irradiated for a very short time, such as 15 ns, by the pulsed laser beam, as stated in the explanation of the first method. Therefore, when the via holes are very narrow, having less than 1 μm diameter, and have a high aspect ratio, such as more than 2, the second method is effective to fill the via holes with the melted metal perfectly.

FIGS. 6(a)-6(c) illustrate the effect of heating the sputtered metal layer 4 when the via holes 3 have a 0.8 μm aperture diameter and a 1.8 μm depth respectively. FIGS. 6(a)-6(c) are cross-sectional views in which a metal layer sputtered on an insulating layer formed on a Si substrate is partially illustrated around a via hole respectively. In FIGS. 6(a)-6(c), the same reference numerals as in FIGS. 5(a)-5(c) designate the same elements as in FIGS. 5(a)-5(c).

In FIG. 6(a), the sputtered metal layer 4 has not yet been irradiated by the pulsed laser beam. In FIG. 6(b), the planarized metal layer 4' has been formed by the irradiation of the pulsed laser beam during which time the device has been heated to a temperature of 200° C. In this case, a cave 43 has been produced in the via hole 3. In FIG. 6(c), the planarized metal layer 4' is formed similarly to as in FIG. 6(b), but while the device has been heated to a temperature of 300° C. In this case, the via hole 3 is completely filled with the melted metal. From the above, it can be understood that under a proper temperature, such as 300° C., the via holes 3 can be perfectly filled with the melted metal even though each via hole has a high aspect ratio, such as 2 or 3. The temperature can not be raised too high, because the electrically conductive material such as Al would have unstable characteristics. For example, it would become easy to be oxidized, and moreover, undesirable tension would be produced between the semiconductor substrate 1 and the insulating layer 2 because of their different coefficients of expansion. Accordingly, due to these possible side effects, as low a temperature as is possible is desirable so that proper filling is accomplished.

The art of the present invention can be extended to apply to a method for forming "buried wirings" in the semiconductor device; wherein the buried wirings are formed in grooves previously formed on a surface of an insulating layer in accordance with a wiring pattern previously designed. The wiring formation is performed by filling via holes with the metal of the buried wirings, and the surface of the buried wirings are flattened to conform with the surface of the insulating layer. In this configuration, the via holes are arranged at the bottom of the grooves.

Figure 7:
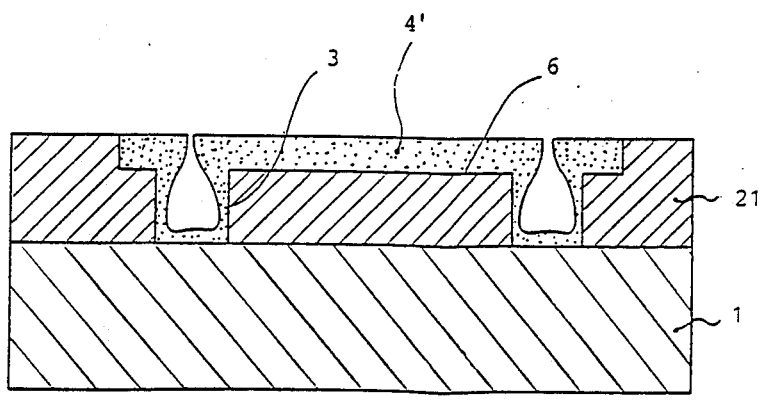
FIG. 7 is a cross-sectional view of a prior art buried wiring connected with via holes.

FIG. 7 is a partial cross-sectional view of a buried wiring formed in an insulating layer by the prior art method. In FIG. 7, the same reference numerals as in FIGS. 5(b) and 5(c) designate the same elements. In FIG. 7, the depth of a groove 6 is 1 μm and the depth of each via hole 3 is 1 to 2 μm. Therefore, the filling of the via holes 3 with the metal, such as Al, corresponds to a case of filling via holes each having a high aspect ratio, such as 2 to 3. In this case, the Al melted by the energy beam irradiation is intended to flow into the via holes 3. However, the melted Al tends to solidify before it completely flows into the via holes 3 because of the heat loss due to the heat radiation from the surface of the melted Al, the convection current by the gas surrounding the surface of the melted Al and the heat conduction to the semiconductor substrate 1 through the insulating layer 2. If the melted Al is solidified before it arrives at the bottom of the via hole, the cave 43 appears in the via hole as shown in FIG. 7.

The above problem can be solved by improving the insulating layer 2 so as to have a double layered structure combining two insulating layers having different heat conductivity to each other. The two insulating layers are composed of a first insulating layer and a second insulating layer. The first layer is formed on a semiconductor substrate and the second layer is formed on the first layer so that the groove is made such that the bottom of the groove is formed by the first layer and the upper sides of the groove are formed by the second layer. The heat conductivity of the two insulating layers is designed so that the heat conductivity of the second layer is smaller than that of the first layer.

Accordingly, when the sputtered metal layer on and around the groove is melted by the laser beam, the temperature of the melted metal (Al) placed at the bottom of the groove falls first, while the temperature of the melted metal at the upper sides of the groove gradually falls. As a result, the melted metal at the bottom of the groove changes to a solid earlier than that at the upper sides of the groove, so that the problem of producing caves in the via holes and sometimes in the groove can be avoided.

FIGS. 8(a)-(h) show a third method embodying the present invention depicting the fabricating steps of the buried wirings of the semiconductor device; wherein, the buried wirings are formed in the grooves provided in an insulating layer having a double layered structure.

Figure 8A:
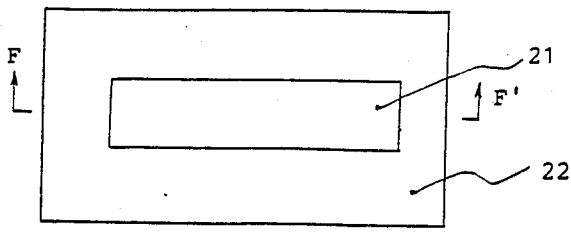
FIGS. 8(a)–8(h) are for showing fabricating steps, embodying the present invention, of a buried wiring.
Figure 8B:
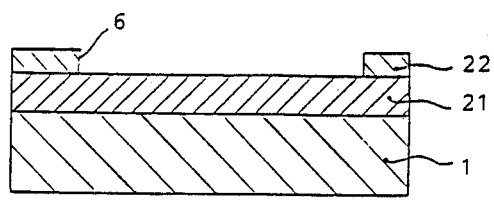
Figure 8C:
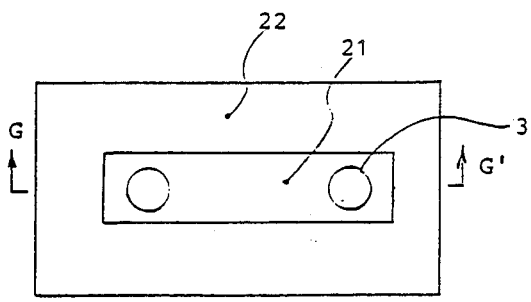
Figure 8D:
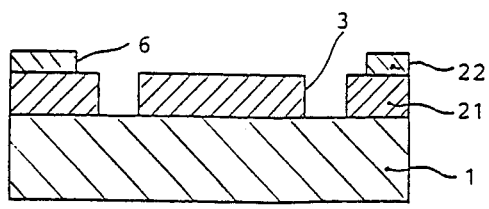
Figure 8E:
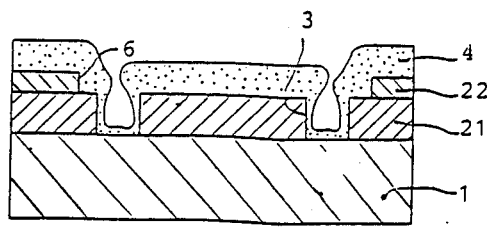
Figure 8F:
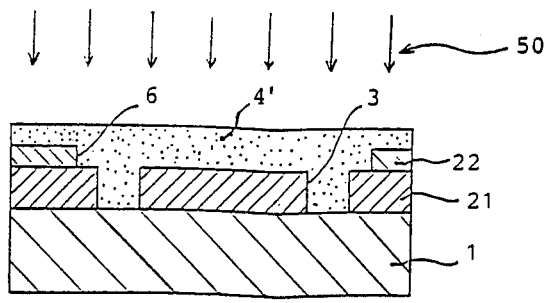
Figure 8G:
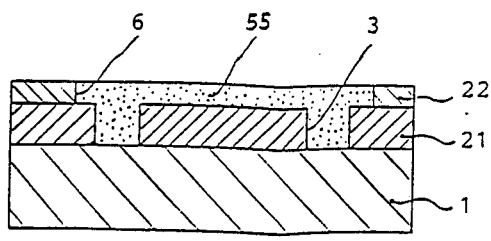
Figure 8H:
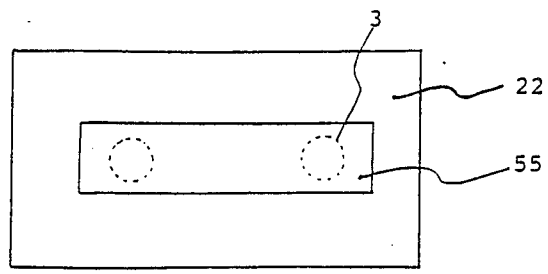

FIGS. 8(a), 8(c) and 8(h) are partial plan views and FIGS. 8(b) and 8(d)-8(g) are partial cross-sectional views for illustrating the fabricating steps of the buried wirings. Actually, the steps for fabricating only one buried wiring are depicted in FIGS. 8(a)-(h). In FIGS. 8(a)-8(h), the same reference numerals as in FIGS. 5(a)-5(d) designate the same elements as in FIGS. 5(a)-5(d).

In FIG. 8(b), a first insulating layer 21, made of SiO2, is formed on a surface, having (100) surface orientation, of Si substrate 1 so as to have 1 μm thickness. Then, a second insulating layer 22, made of phosphosilicate glass (PSG) and having heat conductivity being a half of that of the first layer 21, is formed on the first layer 21 so as to have 0.5 μm thickness. After that, a groove 6 is formed in the second layer 22 so that an upper surface of the first layer appears at the bottom face of the groove 6. The groove 6 is formed so as to have 1-1.5 μm width, by firstly patterning the wiring pattern on the surface of the second layer 22 by photolithography and then removing the PSG layer in the wiring pattern. FIG. 8(a) shows the plan view of FIG. 8(b).

After forming the groove 6 in the second layer 22, as shown in FIG. 8(d), via holes 3 are formed in the first layer 21 by the methods of photolithography and RIE so that each via hole has 1 μm aperture diameter. FIG. 8(c) shows the plan view of FIG. 8(d). Then, as shown in FIG. 8(e), the electrically conductive material 4 is sputtered on the surface shown in FIG. 8(c) by applying, for example, a magnetron sputtering method. Al is used as the electrically conductive material. The thickness of the sputtered Al layer 4 shown in FIG. 8(e) should be as thin as possible for carrying out the planarization of the sputtered Al layer without producing the tearing phenomenon on the planarized Al layer. Usually, the most proper thickness of the sputtered Al layer is determined by considering the volume of the via holes 3 and the grooves 6 to be sputtered and planarized.

After forming the sputtered Al layer 4, the planarization of the sputtered Al layer 4 is carried out by irradiating a pulsed laser beam in a one pulse time duration on the sputtered Al layer 4 in a $1\times10^{-6}$ vacuum. In this embodiment, an ArF excimer laser having a 193 nm wave length and having 200 mJ peak energy and 15 ns optical pulse width is used. The resulting planarized Al layer 4' is obtained, perfectly filling the groove 6 and the via holes 3 with metal Al as shown in FIG. 8(f). Also, in this case, it has been confirmed that good results can be obtained when the fabricating object is heated up to a maximum of 400° C.

Finally, the planarized Al layer 4' is removed and flattened by RIE method, the remaining portion at the groove 6 and the via holes 3 as shown in FIG. 8(g), so that a buried wiring 55 is fabricated as indicated in FIGS. 8(g) and 8(h).

Many experiments on the above third method have been carried out which have confirmed that the cave formation problem or the tearing phenomenon do not occur.

Figure 9:
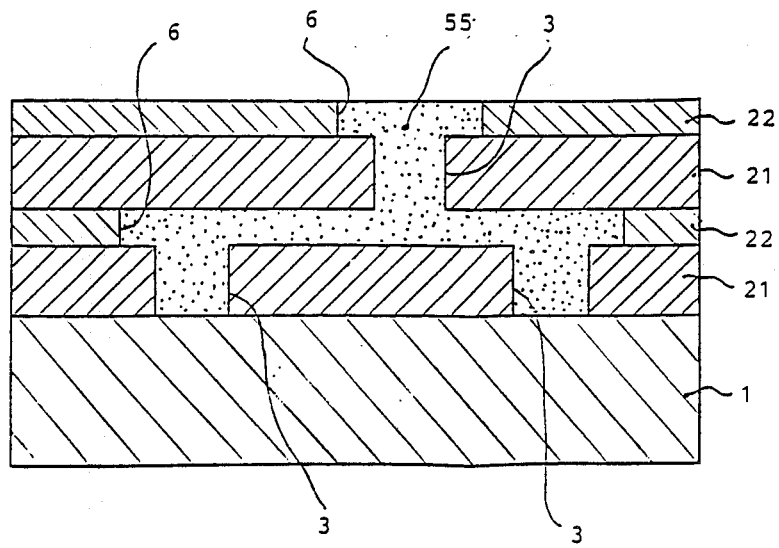
FIG. 9 is a partial cross-sectional view of double layered buried wirings formed by a method embodying the present invention.

FIG. 9 is a partial cross-sectional view of double layered buried wiring structure in a semiconductor device. These buried wirings 55 can be fabricated by repeating the fabricating steps of the above third method. From this figure, it can be seen that very high integration and very high packing density of the semiconductor device can be realized by applying the third method, and the flattened structure of the buried wirings can be formed with high reliability.

In the above first, second and third methods, the following changes are possible: (1) in place of the semiconductor substrate 1, a semiconductor layer formed on a compound semiconductor or sapphire can be used instead of Si;

(2) semiconductor elements or wiring layers formed on a compound semiconductor or sapphire can be used instead of Si;

(3) as the first and the second insulating layer 21 and 22, other kinds of material can be used if the heat conductivity of the material for the first layer is greater than that for the second layer and the melting points of the material are higher than that of the electrically conductive material 4, for example, the combination of $Si_3N_4$ and $SiO_2$, borophosphosilicate glass (BPSG) or spin-on-glass (SOG), formed on the first insulating layer 21 constructed of $Si_3N_4$ or $SiO_2$, can be used as the second insulating layer 22;

(4) as the electrically conductive layer 2, an Al-Si alloy or an Al-Cu alloy can be used instead of Al; and (5) as the energy beam 50, a krypton fluoride (KrF) or a xenon chloride (XeCl) excimer laser, a helium-cadomium (He-Cd) or an argon (Ar) or a krypton (Kr) gas laser, higher harmonics of neodium doped yttrium aluminum garment (YAG) laser or an electron beam can be used instead of an ArF excimer laser.

The utility of the present invention can be evaluated by the following results of experiments conducted by inventor. The experiments will be explained referring to the results shown in FIGS. 10 and 11.

Figure 10:
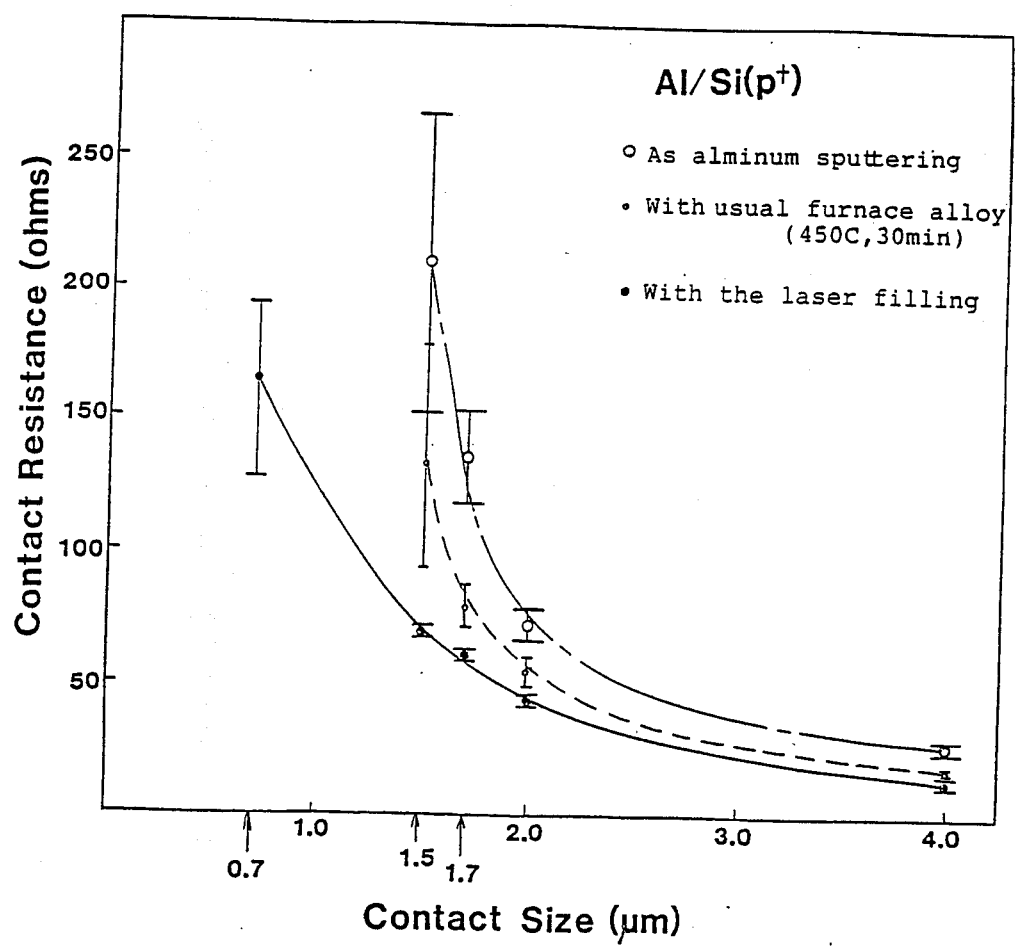
FIG. 10 is a graph illustrating results from experiments studying contact resistance against contact sizes of via holes comparing a laser filling method with the prior art methods.

The first experiment concerned the contact resistance between Al and Si in a via interconnection. A p-type diffused layer having acceptor concentration of more than $10^{19}/cm^3$ is formed on a surface, having (100) surface orientation, of an n-type Si substrate, and the wirings having the via holes are formed on the p-type diffused layer. Then, an experiment as to the relation between the Al-Si contact resistance and the via hole diameter is conducted comparing a case of forming wirings by the prior art method, such as a method with usual furnace alloying, and that by the above method of using the laser filling. The results of the experiment are shown in FIG. 10. In FIG. 10, a case of performing only the Al sputtering is also indicated for comparing with other cases of the prior art method and the laser filling method.

From FIG. 10, it can be understood that the contact resistance for both the prior art method and the laser filling method is smaller than that when only the Al sputtering is performed, which may be a matter of cause. Further, the contact resistance when the laser filling method is used is smaller than when the prior art method is applied, and the difference between contact resistance becomes greater as the contact size is decreased, particularly for the size less than 2 μm. As seen from FIG. 10, in the case of the prior art method, there is no datum for the contact resistance for a size of less than 1 μm. The datum as to 0.7 μm contact size was obtained for the first time when the method of the present invention was established for filling the via holes completely with the metal.

The second experiment illustrated concerns the damage to the semiconductor substrate caused by the laser beam irradiation.

Preparing semiconductor substrates having the same p-n junction as in the first experiment, diodes are fabricated at the p-n junctions so that their sizes are matched to the aperture sizes of via holes respectively. The via holes are formed on the diodes so as to have several aperture sizes respectively, and wirings are formed while filling the via holes with the metal (Al) of the wirings. The wiring formation is performed by only sputtering Al as a first case, applying a usual furnace alloying method (prior art method) after the Al sputtering as a second case, and applying the laser filling method after the Al sputtering as a third case. In the third case, the ArF excimer laser, having characteristics of 193 nm wave length and 5 $J/cm^2$ energy, is used with one shot pulse having 15 ns time duration. Then, leak currents flowing through the diodes are measured. An increase of the leak current indicates an increased amount of damage. The results of the measurements are shown in FIG. 11.

Figure 11:
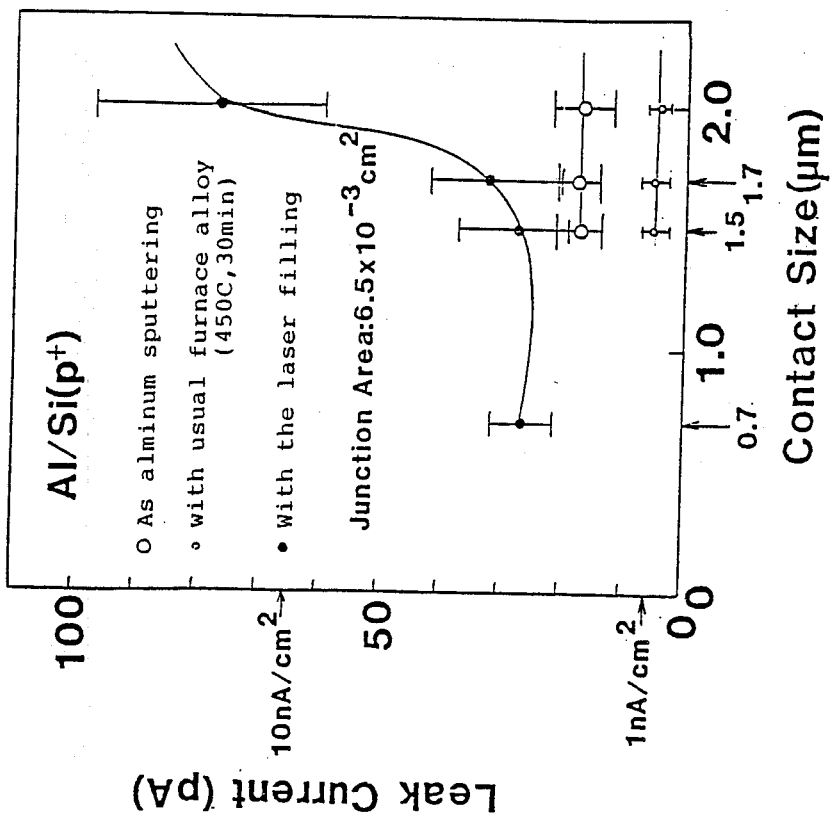
FIG. 11 is a graph illustrating results from experiments studying radiation damage induced by a laser beam in a device.

From FIG. 11, it can be understood that for the third case (the present invention), the leak current decreases suddenly to nearly as small as the leak current for the first or second case when the contact size decreases to less than 2 μm, where the contact size is equal to the aperture size mentioned above.

As seen from the results of the above first and second experiments, the present invention offers an excellent method for fabricating minute wirings of a semiconductor device, particularly of an LSI or VLSI device.

I claim:

1. A method for fabricating a semiconductor device, comprising the steps of:
   (a) forming an insulating layer on a semiconductor substrate;
   (b) forming a recess, having a width of less than 1.0 micrometer and an aspect ratio of more than 1.0, in the insulating layer;
   (c) depositing metal material by sputtering on the insulating layer and in the recess for forming a layer of the metal material having a first thickness; and (d) irradiating a pulsed energy beam over the layer of the metal material on the insulating layer for melting the metal material to form a planarized metal layer extending from the metal material filled in the recess over the insulating layer, the first thickness being such that the planarized metal layer has a thickness more than 0.5 micrometers in the vicinity of the recess.

2. A method according to claim 1, wherein said recess is a via hole through the insulating layer.

3. A method according to claim 1, wherein said recess is a groove in the insulating layer.

4. A method according to claim 1, wherein said recess comprises a groove and a via hole opening in the groove.

5. A method according to claim 1, wherein the insulating layer comprises a first insulating layer and a second insulating layer formed on the first insulating layer and having a lower heat conductivity than that of the first insulating layer.

6. A method according to claim 1, wherein the metal material is selected from the group consisting of aluminum and an aluminum alloy.

7. A method according to claim 1, wherein said pulsed energy beam is a pulsed laser beam with a pulse width of less than 100 nanoseconds.

8. A method according to claim 7, wherein the pulsed laser beam is an excimer laser beam.

9. A method according to claim 6, wherein the step (d) is carried out in an atmosphere selected from the group consisting of a vacuum and an inert gas.

10. A method according to claim 1, wherein the step (d) further comprises heating the semiconductor substrate.

11. A method according to claim 1, further comprising the step of:
(e) patterning the planarized metal layer.

12. A method according to claim 1, wherein said insulating layer is selected from the group consisting of silicon dioxide, phosphosilicate glass (PSG) and borophosphosilicate glass (PBSG).

13. A method according to claim 5, wherein said first insulating layer is $Si_3N_4$, and said second insulating layer is selected from the group consisting of silicon dioxide, phosphosilicate glass and borophosphosilicate glass.

14. A method according to claim 1, wherein said semiconductor substrate is silicon.

15. A method of fabricating a semiconductor device comprising the steps of:
(a) forming a first insulating layer and a second insulating layer, the first insulating layer being formed on a surface of the semiconductor substrate, the heat conductivity of the first insulating layer being greater than that of the second insulating layer;
(b) forming a groove in the second insulating layer;
(c) forming via holes in the groove through the first insulating layer having diameters of less than one $\mu m$ and aspect ratios of more than 1.0;
(d) depositing metal material by sputtering on the second insulating layer and in the groove and the via holes for forming a layer of the metal material having a first thickness;
(e) irradiating a pulsed energy beam on the metal material over the second insulating layer for melting the metal material and forming a planarized metal layer extending from the metal material filled in the groove and the via holes, the first thickness being such that the planarized metal layer has a thickness of more than 0.5 micrometers in the vicinity of the groove; and
(f) removing the planarized metal layer while leaving the metal material in the groove and in the via holes for forming a buried metal interconnection therein having a flattened surface.

16. A method according to claim 15, further comprising the steps of:
(g) forming a third insulating layer on said surface of the buried metal interconnection, and forming a fourth insulating layer having a lower heat conductivity than that of the third insulating layer on the third insulating layer;
(h) forming a groove in the fourth insulating layer;
(i) forming via holes in the groove through the third insulating layer having diameters of less than one $\mu m$ and aspect ratios of more than 1.0;
(j) depositing metal material by sputtering on the fourth insulating layer so as to form a layer of the metal material having a second thickness;
(k) irradiating a pulsed energy beam on the metal material over the fourth insulating layer so as to melt the metal material to form a planarized metal layer extending from the metal material filled in the groove and the via holes, the second thickness being such that the planarized metal layer has a thickness more than 0.5 micrometers in the vicinity of the groove; and
(l) removing the planarized metal layer while leaving the metal material in the groove and in the via holes so as to provide a multi-level buried metal interconnection therein having a flattened surface.

17. A method according to claim 15, wherein the metal material is selected from the group consisting of aluminum and an aluminum alloy.

18. A method according to claim 15, wherein said pulsed energy beam is a pulsed laser beam with a pulse width less than 100 nanoseconds.

19. A method according to claim 18, wherein the pulsed laser beam is an excimer laser beam.

20. A method according to claim 17, wherein the step (e) is carried out in an atmosphere selected from the group consisting of a vacuum and an inert gas.

21. A method according to claim 15, wherein the step (e) further comprises heating the semiconductor substrate.

22. A method according to claim 15, wherein the first insulating layer is $Si_3N_4$ and said second insulating layer is selected from the group consisting of phosphosilicate glass and borophosphosilicate glass.

23. A method according to claim 15, wherein said semiconductor substrate is silicon.

24. A method of fabricating a semiconductor device comprising the steps of:
(a) forming an insulating layer having a thickness of 1 $\mu m$ on a semiconductor substrate;
(b) forming via holes through the insulating layer having widths of less than 1.0 micrometer and aspect ratios of more than 1.0;
(c) depositing metal material on the insulating layer to form a metal material layer having a depth of 0.8 $\mu m$;
(d) heating the semiconductor device to 300° C.–400° C.; and (e) irradiating the metal material layer with a pulsed energy beam for melting the material and forming a planarized metal layer over the insulating layer.

25. A method according to claim 5, wherein the first insulating layer is SiO$_2$, and the second insulating layer is selected from the group consisting of phosphosilicate glass and borophosphosilicate glass.

26. A method according to claim 15, wherein the first insulating layer is SiO$_2$, and the second insulating layer is selected from the group consisting of phosphosilicate glass and borophosphosilicate glass.

* * * * *

UNITED STATES PATENT AND TRADEMARK OFFICE
CERTIFICATE OF CORRECTION

PATENT NO. : 4,920,070           Page 1 of 2

DATED : APRIL 24, 1990

INVENTOR(S) : RYOICHI MUKAI

It is certified that error appears in the above-identified patent and that said Letters Patent is hereby corrected as shown below:

Title page, Col. 2, "FOREIGN PATENT DOCUMENTS"
Please insert the following which was inadvertently omitted at the Patent Office:

--59-96746 6/84 Japan--.

Title page, Col. 2, "OTHER PUBLICATIONS"
Please insert the following which was inadvertently omitted at the Patent Office:

--Tuckerman et al., "Planarization of Gold & Aluminum Thin Films Using a Pulsed Laser", IEEE Electron Device Letters, Vol. EDL-7, No. 1, January 1986.--.

Title page, Col. 2, "ABSTRACT"
line 4, "rolls" should be --holes--.

UNITED STATES PATENT AND TRADEMARK OFFICE
CERTIFICATE OF CORRECTION

PATENT NO. : 4,920,070

DATED : APRIL 24, 1990

INVENTOR(S) : RYOICHI MUKAI

It is certified that error appears in the above-identified patent and that said Letters Patent is hereby corrected as shown below:

IN THE FIGURES, Sheet 7 of 12, "FIG. 7" should be labelled --PRIOR ART--.

Col. 12, line 52, "said" should be --the--.

Signed and Sealed this

Thirteenth Day of August, 1991

Attest:

HARRY F. MANBECK, JR.

*Attesting Officer*      *Commissioner of Patents and Trademarks*